US008677219B2

(12) United States Patent
Lei et al.

(10) Patent No.: US 8,677,219 B2
(45) Date of Patent: Mar. 18, 2014

(54) METHOD AND APPARATUS FOR ADAPTING A BIT INTERLEAVER TO LDPC CODES AND MODULATIONS UNDER AWGN CHANNEL CONDITIONS USING BINARY ERASURE SURROGATE CHANNELS

(75) Inventors: Jing Lei, New Brunswick, NJ (US); Wen Gao, West Windsor, NJ (US)

(73) Assignee: Thomson Licensing, Boulogne-Billancourt (FR)

( * ) Notice: Subject to any disclaimer, the term of this patent is extended or adjusted under 35 U.S.C. 154(b) by 100 days.

(21) Appl. No.: 12/998,270

(22) PCT Filed: Oct. 2, 2009

(86) PCT No.: PCT/US2009/005437
§ 371 (c)(1),
(2), (4) Date: Apr. 1, 2011

(87) PCT Pub. No.: WO2010/039257
PCT Pub. Date: Apr. 8, 2010

(65) Prior Publication Data
US 2011/0182345 A1    Jul. 28, 2011

Related U.S. Application Data

(60) Provisional application No. 61/102,517, filed on Oct. 3, 2008, provisional application No. 61/196,889, filed on Oct. 21, 2008.

(51) Int. Cl.
*H03M 13/00*    (2006.01)
(52) U.S. Cl.
USPC .......................................................... 714/774
(58) Field of Classification Search
USPC .......................................................... 714/774
See application file for complete search history.

(56) References Cited

U.S. PATENT DOCUMENTS 7,116,710 B1 *    10/2006    Jin et al. ......................... 375/240
7,613,985 B2 *    11/2009    Pons et al. ..................... 714/774
2002/0136318 A1 *    9/2002    Gorokhov et al. ............. 375/261

FOREIGN PATENT DOCUMENTS

CN    1543088 A    11/2004

OTHER PUBLICATIONS

Kienle et al., "Macro Interleaver Design for Bit Interleaved Coded Modulation with Low-Density Parity-Check Codes", Microelectronic Systems Design Research Group, 2008 IEEE.

(Continued)

*Primary Examiner* — Albert Decady
*Assistant Examiner* — Enam Ahmed
(74) *Attorney, Agent, or Firm* — Robert D. Shedd; Jeffrey M. Navon

(57) ABSTRACT

The present invention relates to code-dependent bit interleavers for parallel non-uniform channels. Since the channel dependence of a given code ensemble is dominated by the mutual information between the channel input and output, the present invention proposes to simplify the analysis about the decoding behavior by using a set of surrogate binary erasure channels. The approximation of the actual channel by the surrogate BEC is established on the equivalence of bitwise capacities, which represent the mutual information between the uniformly-distributed binary input and the likelihood ratios of the effective parallel AWGN channels. Moreover, the transition of the erasure probabilities is modeled by a linear difference equation around the decoding threshold SNR, from which we can derive a necessary condition on the convergence of decoding iterations and achieve a useful guideline for the configuration of the bit interleaver.

25 Claims, 14 Drawing Sheets

(56) References Cited

OTHER PUBLICATIONS

Kos et al., "The Performance of Flexible LDPC Codes on Gaussian Channels with Bursty Erasures", TrellisWare Technologies, Inc., 2008 IEEE, San Diego, CA.

Lei et al., "Matching Graph Connectivity of LDPC Codes to High-Order Modulation by Bit Interleaving", Forty-sixth Annual Allerton Conference, Sep. 23-26, 2008, 2008 IEEE.

Liu et al., "Reliable Channel Regions for Good Binary Codes Transmitted Over Parallel Channels", IEEE Transactions on Information Theory, vol. 52, No. 4, Apr. 2006.

Pishro-Nik et al., "Nonuniform Error Correction Using Low-Density-Parity-Check Codes", IEEE Transactions on Information Theory, vol. 51, No. 7, Jul. 2006.

Pishro-Nik et al., "Results on Non-uniform Error Correction Using Low-Density Parity-Check Codes", Globecome 2003, School of Electrical and Computer Engineering, 2003 IEEE.

Peng et al., "Design and Analysis of eIRA Codes on Correrlated Fading Channesl", IEEE Communications Society, Globecom 2004, Tucson, Arizona, 2004 IEEE.

Peng et al., "Surrogate-Channel Design of Universal LDPC Codes", IEEE Communications Letters, vol. 10, No. 6 Jun. 2006.

Richardson et al., "Design of Capacity-Approaching Irregular Low-Density Parity-Check Codes", IEEE Transactions on Information Theory. vol. 47, No. 2, Feb. 2001.

Yang et al., "Optimization of Degree-Profile Matching Interleavers for LDPC-Coded Modulation", IEEE Communications Letters, vol. 10, No. 12, Dec. 2006.

Franceschini et al., "Does the performance of LDPC Codes Depend on the Channel?", IEEE Transactions on Communications, vol. 54, No. 12, Dec. 2006.

Search Report Dated Dec. 23, 2009.

\* cited by examiner

FIG. 1C

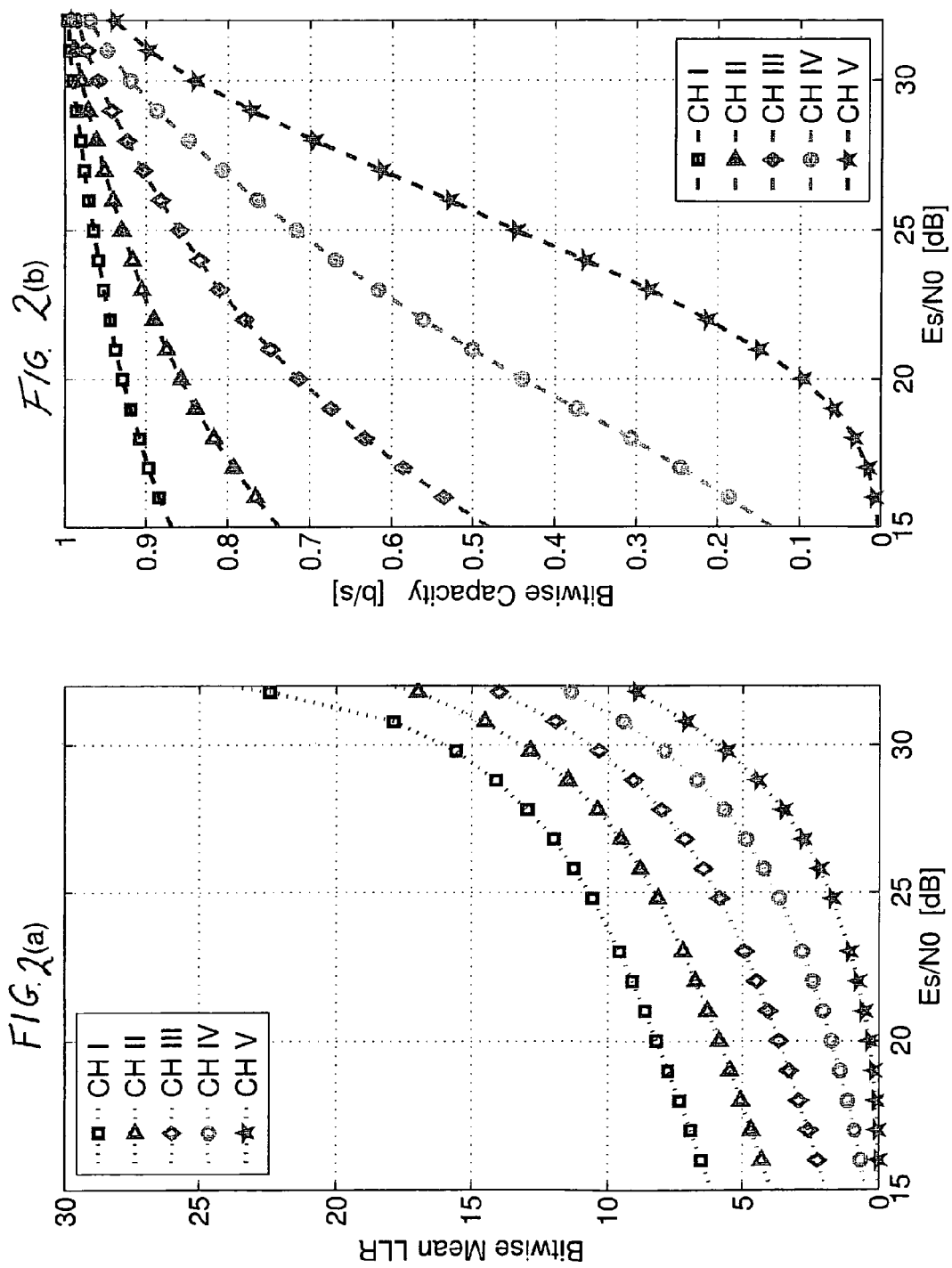

METHOD AND APPARATUS FOR ADAPTING A BIT INTERLEAVER TO LDPC CODES AND MODULATIONS UNDER AWGN CHANNEL CONDITIONS USING BINARY ERASURE SURROGATE CHANNELS

CROSS REFERENCE TO RELATED APPLICATIONS

This application claims the benefit, under 35 U.S.C. §365119 of PCT Patent Application PCT/US2009/005437, filed Oct. 2, 2009. International Publication WO2010/039257 which was published in accordance with PCT Article 21(2) on Apr. 8, 2010 in English and which claims the benefit to U.S. Provisional Patent Applications No. 61/102,517 filed Oct. 3, 2008 and No. 61/196,889 filed Oct. 21, 2008.

TECHNICAL FIELD

The present invention relates to code-dependent bit interleavers for parallel non-uniform channels. More particularly, it relates to code matched interleaving utilizing a set of surrogate binary erasure channels (BEC).

BACKGROUND

Cable, satellite and terrestrial networks are three major mediums to deliver digital broadcasting services to end customers. Unlike satellite and terrestrial transmission, cable channels do not exhibit significant time and frequency selectivity. Consequently, spectrally efficient modulations (i.e., 256-QAM and 1024-QAM), are employed in cable networks to meet the capacity demand of bandwidth-consuming services such as HDTV and VoD, and to boost the penetration of digital video broadcasting. Recently, low-density parity-check (LDPC) codes have been introduced in DVB-S2 and DVB-T2 standards because of their design flexibility, decoding simplicity and the universally excellent error correction performance over various channel types.

Out of the consideration for implementation simplicity and components inter-operability, the LDPC codes specified in DVB-S2 standards are strongly recommended to be reused for next generation DVB-C system. Nevertheless, it is well known that a LDPC code ensemble, optimized in the context of binary modulation, does not necessarily work well for higher-order modulations, which is due to the unequal error protections incurred by modulations. The asymptotic performance of multilevel coding (MLC) for infinite code length has been investigated and has proven its optimality as a capacity approaching strategy when multistage decoding (MSD) is employed. However, the MSD algorithm requires decisions from lower decoding stages to be passed on to higher stages, which results in large decoding latency that may be unacceptable to high-speed applications.

As is appreciated by those of skill in the art of communication systems, interleaving is a procedure for rearranging the order of a sequence to fulfill different objectives. For channels subject to selective fading over time and frequency domains, bit and/or symbol interleaving have been used in conjunction with channel coding to distribute the error bursts. In addition, bit interleaving is employed by concatenated codes, particularly Turbo codes, to scramble the information bits to the second constituent encoder so that a long random code can be generated.

As a result of LDPC codes, frameworks such as, for example, density evolution, differential evolution and extrinsic information transfer (EXIT) charts, have been invoked to design and analyze the degree profile of a code ensemble. In terms of the threshold SNR for decoding convergence, codes constructed following these frameworks can approach the Shannon limit closely, assuming the block length is infinite, the code structure is random and the number of decoding iterations is unbounded. However, from the perspective of practical implementation, the random structure usually leads to prohibitive encoding/decoding complexity and memory requirements. For this reason, structured LDPC codes that can achieve a better tradeoff between power efficiency and implementation simplicity have become a more appealing option for system designers. For instance, the error control codes adopted by ETSI Second Generation Digital Video Broadcasting Standard for Satellite Channels (DVB-S2), IEEE 802.11n and IEEE 802.1 le standards all belong to the category of structured LDPC codes.

On the other hand, the DVB-S2 LDPC codes family, which were originally designed for forward error control in satellite communications, have been reused by DVB-T2 (Second Generation DVB Standard for Terrestrial Channels), and are strongly recommended for DVB-C2 (Second Generation DVB Standard for Cable Channels). In addition to the consideration for system compatibility, the main reason behind the reuse of DVB-S2 codes can be attributed to their universal superior performance under various channel conditions. However, to meet the demand by cable operators for higher spectral efficiency and flexible throughputs, a technical challenge for reusing the DVB-S2 codes in DVB-C2 lies in the mapping of the given codes to constellations of very high order, which range from 256-QAM to 4096-QAM.

SUMMARY

The present invention proposes to simplify the design of code-dependent bit interleaver using a surrogate channel approach.

In order to achieve a good tradeoff between power and spectral efficiency while maintaining the simple structure of the CODEC, the present invention proposes to insert a bit interleaver/de-interleaver between the channel encoder/decoder and the modulator/demodulator, respectively.

In addition, given an irregular LDPC code and a constellation mapper (modulator) for high-order modulations (e.g., 256-QAM), a bit interleaver can be exploited to match the unequal error corrections of the code to the asymmetric bit-wise Euclidean distance separation inherent to a binary labeling scheme.

According to one implementation, the method for adapting a bit interleaver to LDPC codes and modulations under AWGN channel conditions includes calculating a bitwise capacity of non-uniform parallel AWGN channels, approximating the AWGN channels with a set of Q surrogate binary erasure channels (BEC) with an erasure probability, determining whether a decoding threshold SNR results in a lowest decoding threshold SNR for a bit interleaver configuration, and configuring the bit interleaver based on the bit interleaver configuration corresponding to the determined lowest decoding threshold SNR.

In another implementation, the apparatus for adapting a bit interleaver to LDPC codes and modulations under AWGN channel conditions includes a processor configured to: i) calculate a bitwise capacity of non-uniform parallel AWGN channels; ii) to approximate the AWGN channels with a set of surrogate binary erasure channels; and (iii) to determine a decoding threshold SNR for each of one or more bit interleaver configurations. The processor also determines an erasure probability for each determined SNR. A memory stores the one or more determined decoding threshold SNR and corresponding bit interleaver configuration. The bit interleaver is configured by the processor based on the bit interleaver configuration corresponding to a selected lowest decoding threshold SNR from the stored one or more determined decoding threshold SNR.

These and other aspects, features and advantages of the present principles will become apparent from the following detailed description of exemplary embodiments, which is to be read in connection with the accompanying drawings.

BRIEF DESCRIPTION OF THE DRAWINGS

The present principles may be better understood in accordance with the following exemplary figures, in which:

FIGS. 2a and 2b are graphical representations of channel conditions for an exemplary constellation mapper according to an implementation of the invention;

DETAILED DESCRIPTION

Figure 1A:
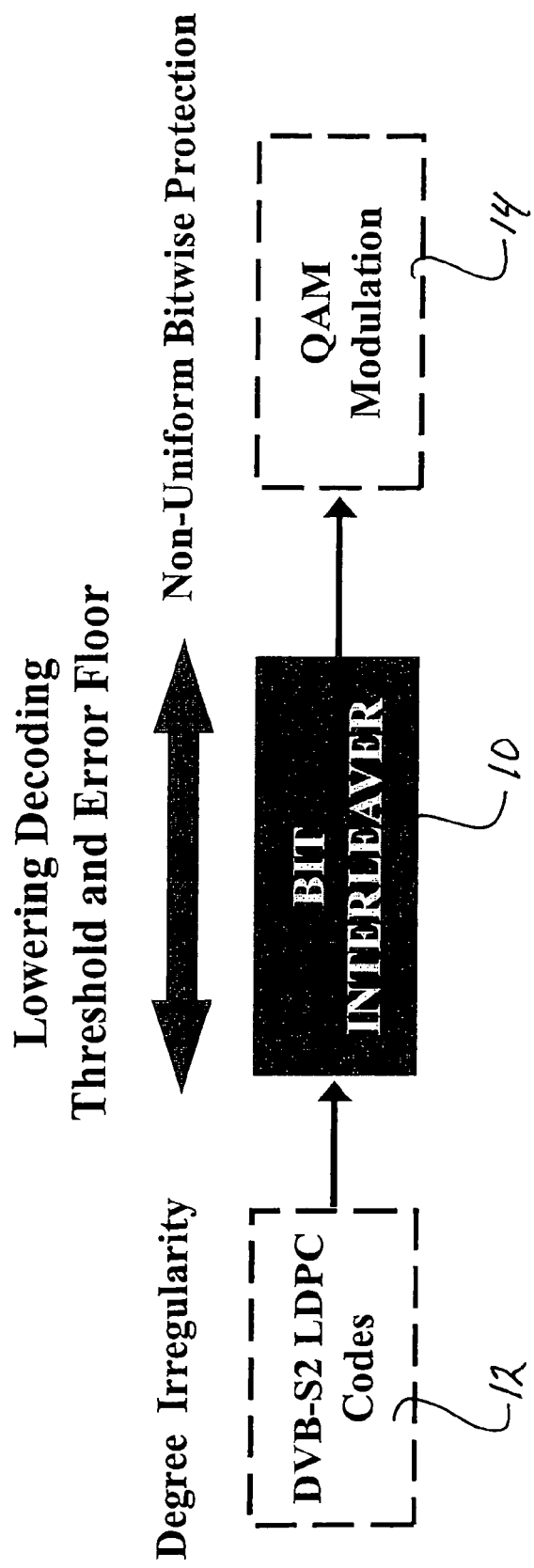
FIG. 1a is a block diagram of the apparatus for code matched interleaving according to an implementation of the invention.

The present principles are directed to methods and apparatus for code-matched interleaving over surrogate channels.

The present description illustrates the present principles. It will thus be appreciated that those skilled in the art will be able to devise various arrangements that, although not explicitly described or shown herein, embody the present principles and are included within its spirit and scope.

All examples and conditional language recited herein are intended for pedagogical purposes to aid the reader in understanding the present principles and the concepts contributed by the inventor(s) to furthering the art, and are to be construed as being without limitation to such specifically recited examples and conditions.

Moreover, all statements herein reciting principles, aspects, and embodiments of the present principles, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the present principles. Similarly, it will be appreciated that any flow charts, flow diagrams, state transition diagrams, pseudocode, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read-only memory ("ROM") for storing software, random access memory ("RAM"), and non-volatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The present principles as defined by such claims reside in the fact that the functionalities provided by the various recited means are combined and brought together in the manner which the claims call for. It is thus regarded that any means that can provide those functionalities are equivalent to those shown herein.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

The present invention proposes to simplify the design of code-dependent bit interleaver using a surrogate channel approach.

Basically, the analysis about the behavior of a message passing decoder involves two important choices. One is the modeling of the effective channel, and the other is the selection of analytical tools to track the iterative decoding process. So far, the performance of a LDPC code ensemble has been examined under various types of channels with binary input. Both theoretical analysis and simulation results demonstrate that the decoding threshold does not depend appreciably on the channel type, but on the mutual information between the input and the output of the effective channel.

On the other hand, a variety of one-dimensional Gaussian approximations (GA) have been introduced to simplify the analysis of iterative decoding, which not only reduces the complexity of density evolution but also provides useful insight to understand the decoding algorithm. Nevertheless, since the Gaussian model does not faithfully capture the probability distribution of messages transferring from check nodes (CND) to variable nodes (VND), GA is a pragmatic but non-rigorous approach, especially for low code rates and CNDs with medium to high degrees.

To overcome this problem, a stochastic framework based on a two-dimensional Gaussian model has been proposed to render a more accurate approximation for the dynamics of the decoding process. However, due to the complexity involved, this approach is hard to be extended to non-uniform channels, such as the parallel channels incurred by high-order modulations, OFDM and the disk channels with non-equal error protection requirements.

In order to avoid the limitations of GA, the present invention models the non-uniform parallel channels by a set of surrogate binary erasure channels (BEC), and the approximation of the channel is based on the equivalence of bitwise capacities, which represent the mutual information between the binary input and the effective output of the parallel AWGN channels. As a result, the evolution of the average erasure probability can be fully characterized by a set of recursive equations. Furthermore, under high SNR regime (close to the decoding threshold), the decoder's dynamics can be further simplified by a homogeneous linear difference equation, from which a necessary condition can be derived for the decoding convergence and then exploited to configure the bit interleavers.

Unlike wireless communication, cable channels usually operate in high signal to noise ratio (SNR) regime and encounter little or no selective fading during the course of signal transmission. Therefore, we can formulate them as additive white Gaussian noise (AWGN) channels, over which spectrally-efficient modulations such as 256-QAM and 4096-QAM can be deployed. In order to guarantee the communication reliability subject to a constraint on the average transmission power, capacity-approaching error correction codes such as LDPC are needed to be employed in combination with these high order modulations. Without loss of generality, we assume the modulation format is square QAM of order $2^Q$.

A binary reflected gray coding (BRGC) will be employed to label the constellation mapper (e.g., QAM modulator) due to its proven optimality. In this implementation, we assume the Q coded bits $\{C_{l,q}\}_{q=1}^Q$ are gathered in a group and mapped to a QAM symbol $x_l$, where l is the symbol index. Particularly, bits $C_{l,q}$ and $C_{l,q+Q/2}$ (q=1, 2, ... Q/2) are used to label the in-phase (I) and quadrature (Q) branches of the QAM constellation, respectively. As a result, they will have identical bitwise capacities when parallel decoding is employed. At the output of the AWGN channel, the l-th received symbol is given by $$y_l = x_l + \omega_l, \quad (1)$$

where $\omega$ denotes sample of circularly-symmetric, complex Gaussian noise with double-sided spectral density $N_0/2$, and the average symbol energy for $x_l$ is assumed to be $E_s$.

To extend the application of concentration theorem to the non-uniform bitwise sub-channels induced by high-order modulations, augmented channel adapters have been introduced to enforce channel symmetry. Consequently, it is sufficient to track the density evolution (DE) of an all-zero codeword to predict the performance of the entire codebook. Those of skill in the art will recognize that density evolution (DE) plays a fundamental role in the design and analysis of iterative systems. In particular, DE has served as a practical tool for designing capacity approaching LDPC codes since it can predict accurately the asymptotic performance of code ensembles. Basically, DE requires the implementation of two distinct convolutions, one for the VND side and the other for the CND side.

Figure 1B:
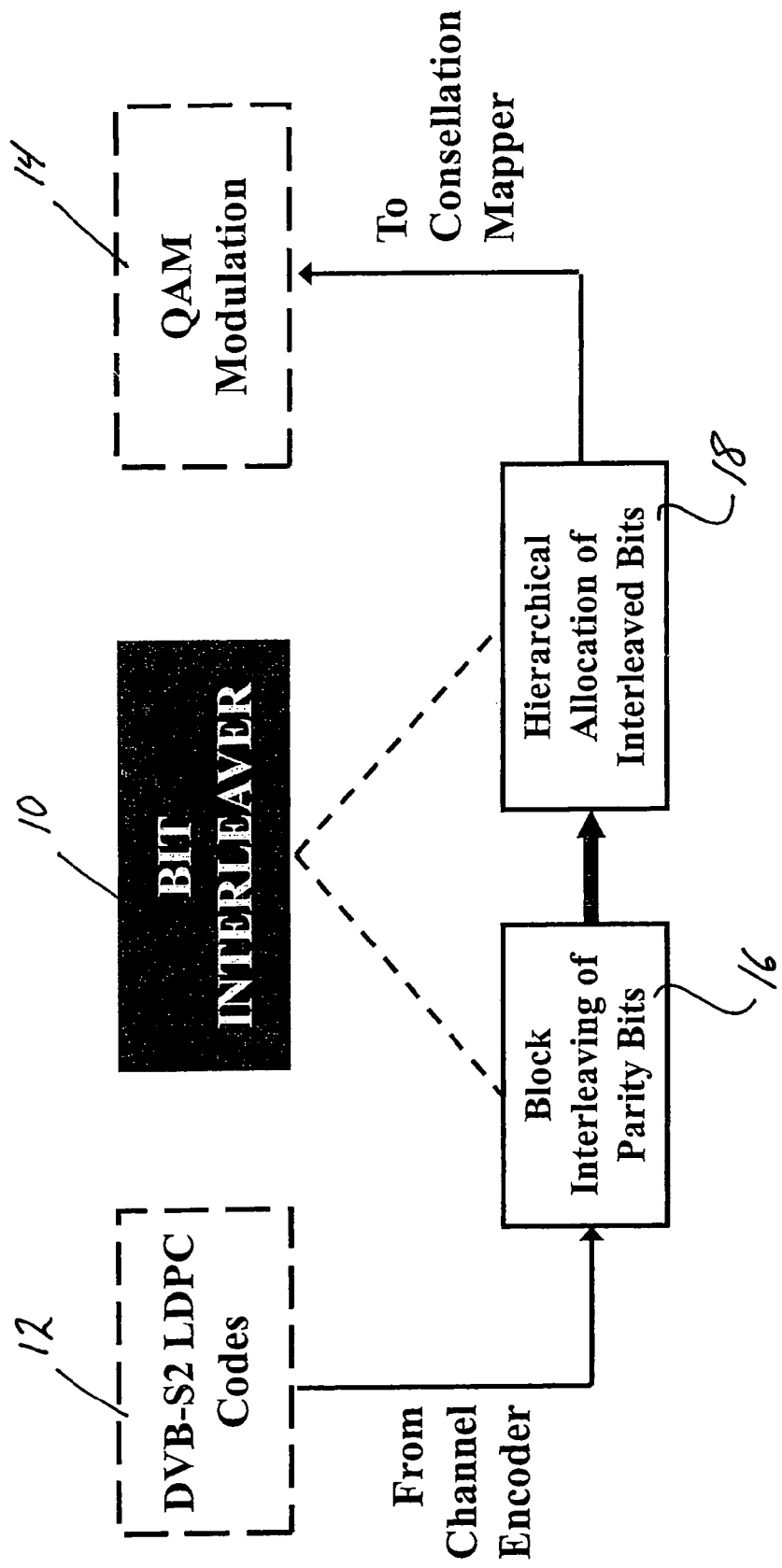
FIG. 1b is a block diagram of the apparatus for code matched interleaving according to an implementation of the invention.
Figure 1D:
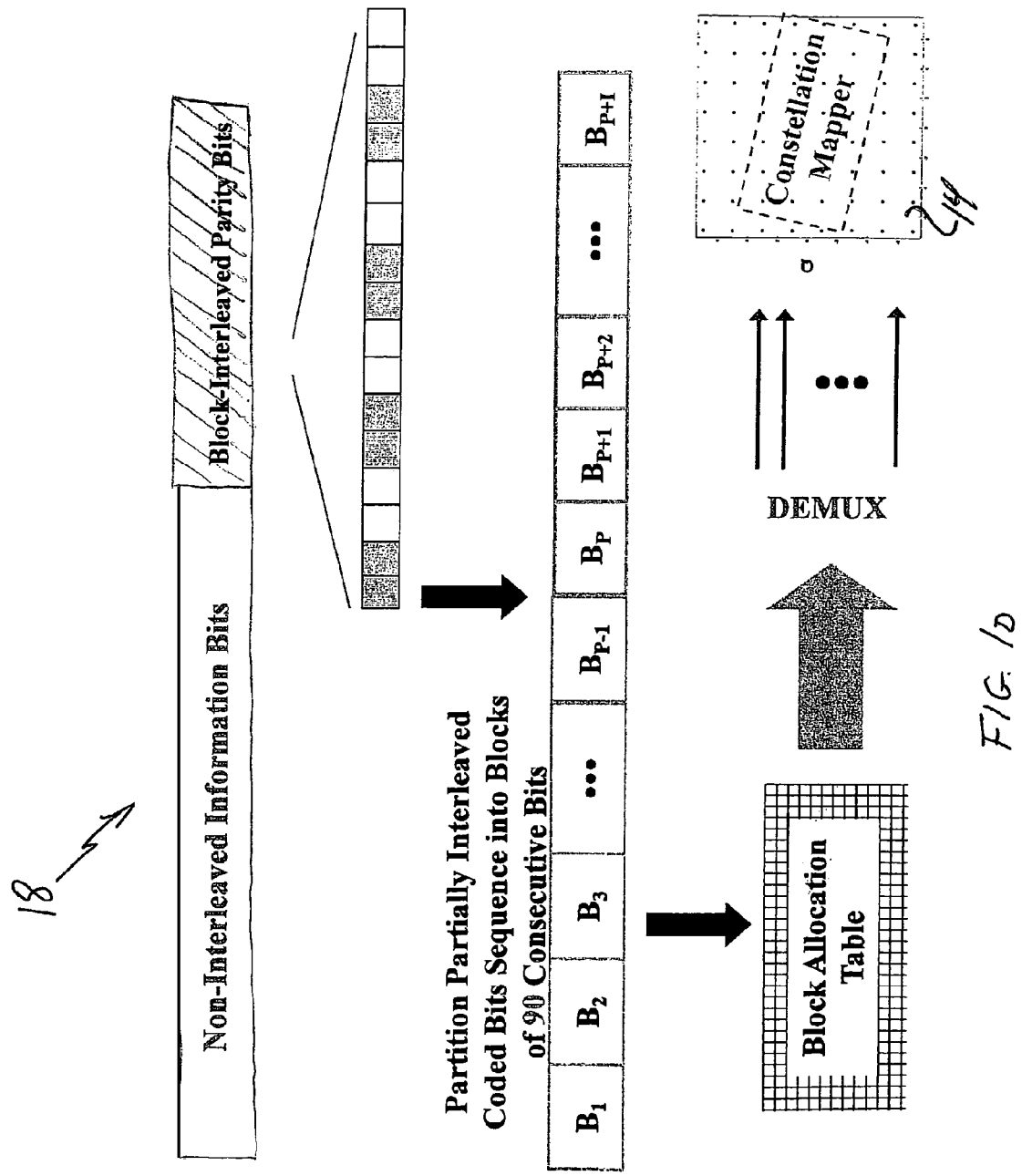
FIG. 1d is a graphical representation of the hierarchical allocation of interleaved bits according to an implementation of the invention; embodiment of the code matched interleaving of the invention.

FIGS. 1a and 1b show high level block diagrams of system model of an LDPC coded bit interleaver modulation system according to an implementation of the present principles. As shown, the bit interleaver 10 is inserted between the input LDPC codes (i.e., the encoder) 12 and the Modulator 14. With this design the decoding threshold and error floor are more easily identified and determined. As shown in FIG. 1b, the bit interleaver can include a block interleaving of parity bits 16 and a hierarchical allocation of interleaved bits 18. FIG. 1c shows an example of the block interleaving of parity bits 16 and FIG. 1d shows one example of hierarchical allocation of partially interleaved coded bits.

Figure 1E:
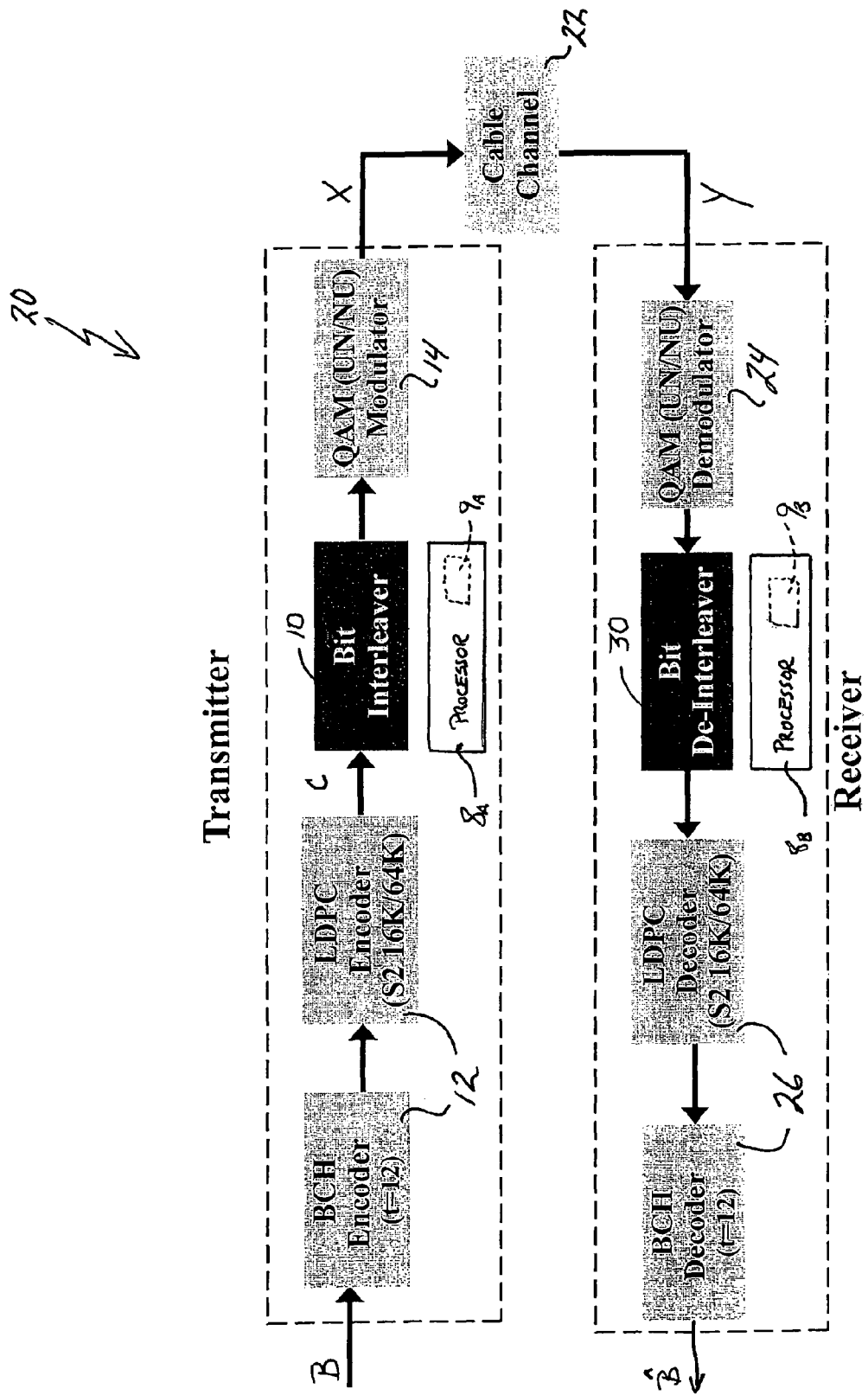
FIG. 1c is a graphical representation of the block interleaving of parity bits according to an implementation of the invention.
FIG. 1f is the more detailed system diagram as that shown in FIG. 1e.
FIG. 1g is a simulation setting for the apparatus for code matched interleaving according to an implementation of the invention.

FIG. 1e shows a communication system model of an LDPC coded bit-interleaver modulation system 20 according to an implementation of the invention. The transmitter side is made up of the BCH and LDPC encoders 12, the bit interleaver 10 and the Modulator (constellation mapper) 14. In addition, those of skill in the art realize that a processor 8a and memory 9a can be used to manage the processed and methods disclosed herein. The receiver side includes the demodulator 24, the bit de-interleaver 30, the LDPC and BCH decoders 26, and a processor 8b and memory 9b. In this binary LDPC-coded system, it is assumed that all coded bits have uniform distribution on set $\{0,1\}$. C and Y denote the output of the channel encoder and the output of the AWGN channel, respectively.

Figure 1F:
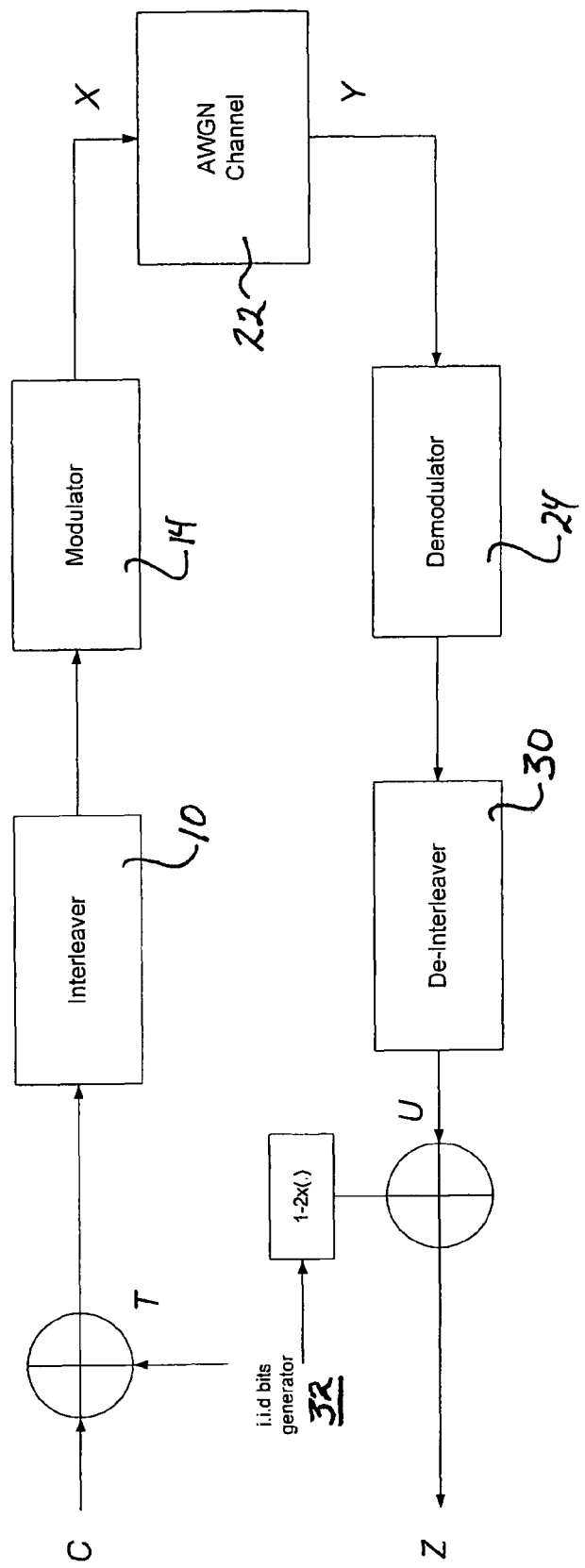

In the embodiment shown in FIG. 1f, an independent identically distributed (I.I.D.) bit generator 32 is imposed on a generic BICM (bit interleaved coded modulation) system model. As a result, the augmented channel between input C (coded bits) and output Z (bit-wise LLR of demodulator output) satisfies the symmetry condition of $$P(Z=z|C=0)=P(Z=-z|C=1) \quad (2)$$

Due to the non-uniform Euclidean distance spectrum incurred by a specific labeling strategy, the bitwise error protection depends on the bits index of the labeling string.

In light of this, the composite channel comprising a $2^Q$-ary QAM constellation mapper (modulator) 14, the AWGN channel 22 and the demodulator 24 can be decomposed into Q binary-input AWGN (BIAWGN) sub-channels. Assuming the input of sub-channel q has uniform distribution over the discrete set $\{0, 1\}$, then its capacity equals the mutual information between the input $C_{l,q}$ and the log likelihood ratio (LLR) $Z_{l,q}$ at the output of the demodulator 24. To illustrate, we look at a BRGC labeled uniform 1024-QAM constellation. Effectively, there are $(\log_2 1024)/2=5$ distinctive sub-channels on the bit level provided the labeling schemes for the I and Q branches are identical, which are indexed by I to V according to the descending magnitude of the mean LLR. FIGS. 2(a) and 2(b) show graphical representations of the bitwise mean LLR (2a) and the bitwise capacity (2b) as a function of the symbol SNR, respectively, wherein the bitwise channel belongs to the category of symmetric BIAWGN and is a function of the conditional probability $P(Z_{l,q}|C_{l,q})$, q=1, 2, ... 5. It can be observed from these graphical representations that the reliability of a particular bitwise channel is proportional to its bitwise mean LLR and bitwise capacity as well. Moreover, the ordering of reliability reflected by these two metrics coincide with each other.

Figure 1G:
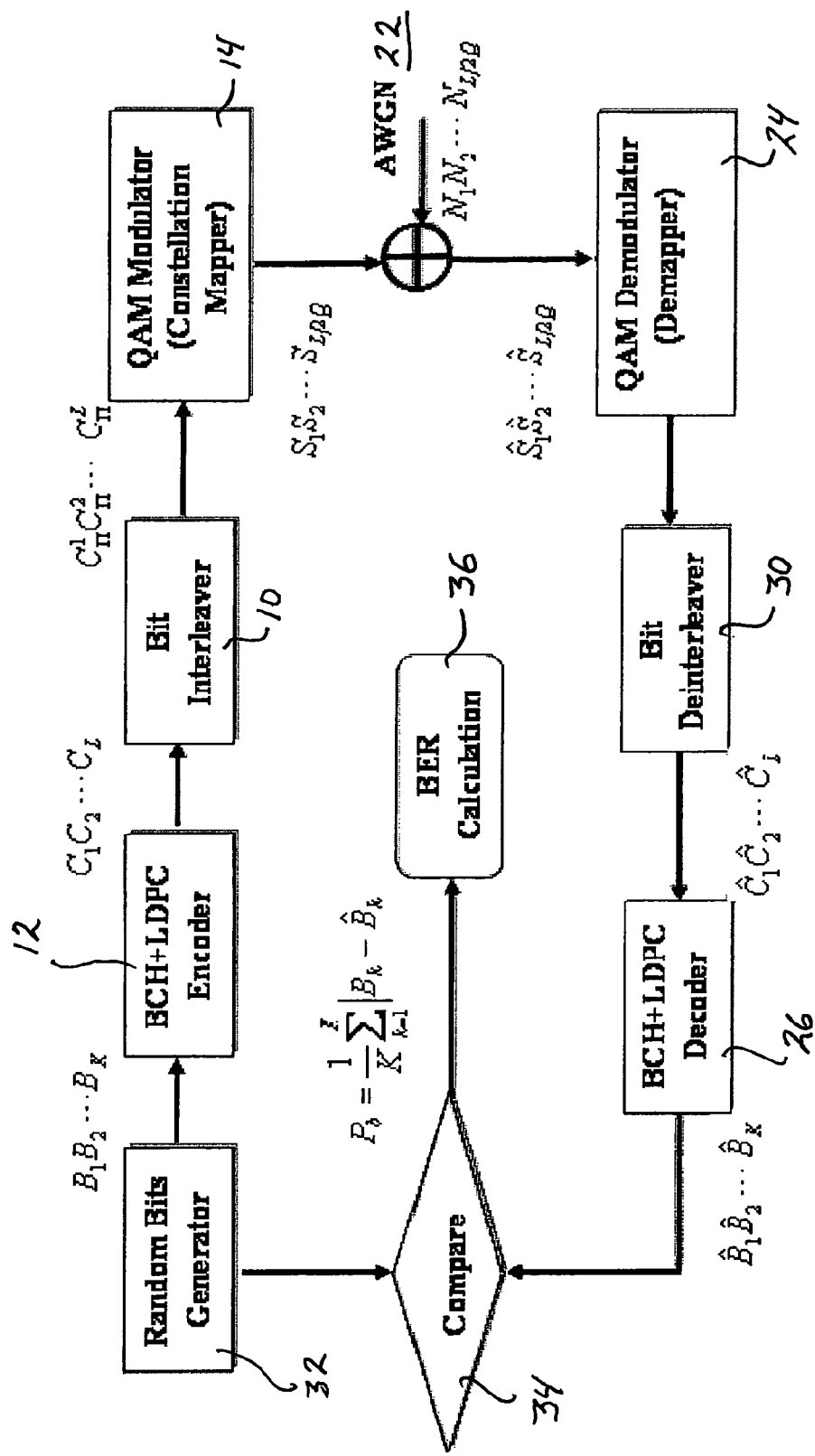

FIG. 1g shows a block/flow diagram of the simulation steps of the invention. The input and output are compared 34 and the bit error rate (BER) is calculated.

Bit Interleaver Design Using Surrogate Channels

Surrogate BEC Channels

Those of skill in the art will appreciate that, as stated above, the decoding threshold of a given LDPC code ensemble mainly depends on the mutual information between the input and the output of the effective channel, rather than the channel type itself. For this reason, we can substitute the Q non-uniform channels formulated above by Q binary erasure channels (BEC) with erasure probabilities $\{\epsilon_q^0\}_{q=q}^{Q}$ and the substitution is based on the equivalence of $$I(Z_{l,q}; C_{l,q}) = 1 - \epsilon_q^0, q = 1, 2, \ldots Q, \quad (3)$$

where the term on the left-hand-side of the equation denotes the bitwise capacity of (BIAWGN) subchannel q with uniform input, and the right-hand-side of the equation is exactly the capacity of the BEC subchannel q.

Figure 3A:
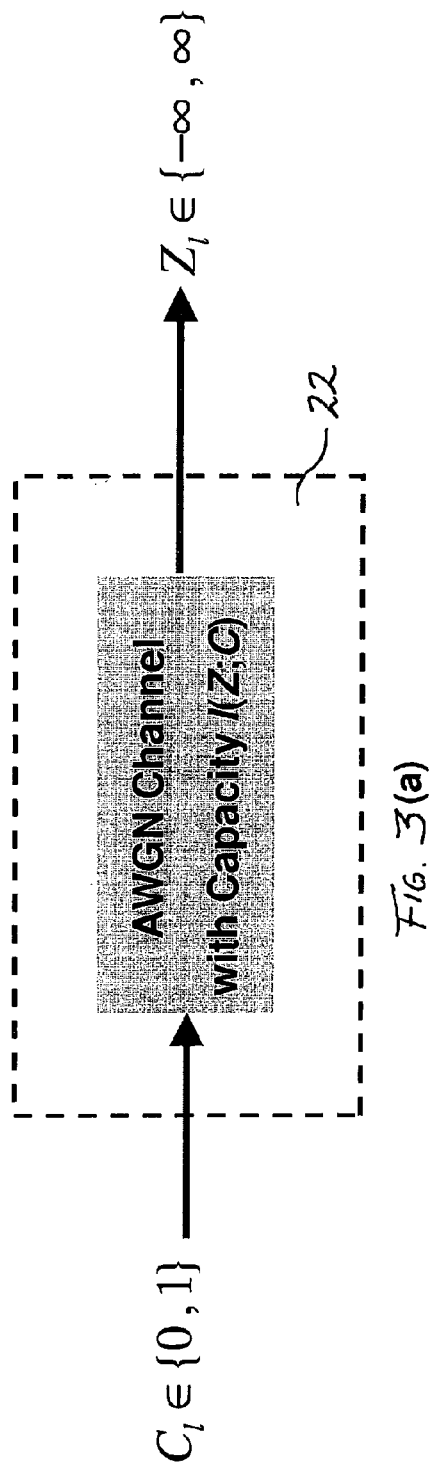
FIG. 3a shows a block diagram of an AWGN channel with a predetermined capacity.
Figure 3B:
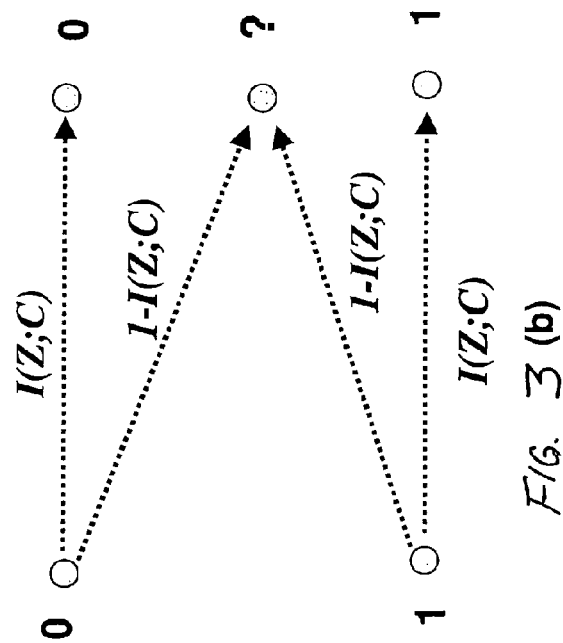
FIG. 3b shows a binary erasure channel (BEC) having an erasure probability according to an implementation of the invention.

FIG. 3(a) depicts an AWGN channel with binary input C and continuous output Z. FIG. 3(b) shows the BEC surrogate channel for AWGN Channel shown in FIG. 3(a) with erasure probability 1−I(Z;C). From equation (3), the binary AWGN channel and the binary BEC surrogate channel have the same mutual information between the input and output of the two channels. Based on the use of surrogate BEC, the investigation of the decoding behavior is greatly simplified, since the task of tracking the decoding trajectory is reduced to observing the evolution of erasure probability on each subchannel. As a result, the prohibitive complexity incurred by "infinite dimensional algebra" of a generic density evolution algorithm is circumvented. In addition, the BEC substitution in equation (3) eliminates the need to invoke the Gaussian approximation in a subsequent analysis, which is one of the leading causes for the deviation from the true decoding trajectory.

Actually, those of skill in the art will recognize that the substitution in equation (3) is not limited to the composite channel comprising a constellation mapper (e.g., modulator), an AWGN channel and a demodulator as it can be generalized to an arbitrary set of memory-less parallel channels with non-uniform error correction capabilities. Examples include the frequency-selective subchannels in OFDM systems and the volume holographic memory (VHM) systems with unequal requirements for error resistance.

Bit Interleaving for LDPC Coded Modulation

Table 1 shows an example of the VND and CND degree distribution for the eleven LDPC codes standardized in DVB-S2, whose coding rates range from ¼ to 9/10. In order to simplify their degree profile descriptions, the VND degree types can be reduced to 3 since there is only one degree-1 VND. Furthermore, we can assume CND regularity because there is a single CND whose degree differs from its counterparts. It is known that such a small perturbation has negligible effect on the performance of corresponding code ensembles. However, this simplification greatly reduces the design complexity of the bit interleavers of the present invention.

TABLE 1

| Rate | VND Degree Category | # of VND in Each Category | CND Degree Category | # of CND in Each Category |
|---|---|---|---|---|
| ¼ | (12, 3, 2, 1) | (5400, 10800, 48599, 1) | (3, 4) | (1, 48599) |
| ⅓ | (12, 3, 2, 1) | (7200, 14400, 43199, 1) | (4, 5) | (1, 43199) |
| ⅖ | (12, 3, 2, 1) | (8640, 17280, 38879, 1) | (5, 6) | (1, 38879) |
| ½ | (8, 3, 2, 1) | (12960, 19440, 32399, 1) | (6, 7) | (1, 32399) |
| ⅗ | (12, 3, 2, 1) | (12960, 25920, 25919, 1) | (10, 11) | (1, 25919) |
| ⅔ | (13, 3, 2, 1) | (4320, 38880, 21599, 1) | (9, 10) | (1, 21599) |
| ¾ | (12, 3, 2, 1) | (5400, 43200, 16199, 1) | (13, 14) | (1, 16199) |
| ⅘ | (11, 3, 2, 1) | (6480, 45360, 12959, 1) | (17, 18) | (1, 12959) |
| ⅚ | (13, 3, 2, 1) | (5400, 48600, 10799, 1) | (21, 22) | (1, 10799) |
| 8/9 | (4, 3, 2, 1) | (7200, 50400, 7199, 1) | (26, 27) | (1, 7199) |
| 9/10 | (4, 3, 2, 1) | (6480, 51840, 6479, 1) | (29, 30) | (1, 6479) |

According to one implementation of the present principles, we assume the edge-perspective variable node (VND) and check node (CND) degree distributions of the binary LDPC code are given by:

$$\lambda(x) = \sum_{i=1}^{d_v} \lambda_i x^{i-1}, \quad (4)$$

and $$\rho(x) = \sum_{j=1}^{d_v} \rho_j x^{j-1}, \quad (5)$$

respectively, where $\{\lambda_i\}$ and $\{\rho_j\}$ designate the proportion of edges connected to degree-i VND and degree-j CND.

The fundamental function of the bit interleaver of the present invention is to partition the L coded bits exclusively into Q subsets of size L/Q and then allocate them to the q-th (q=1, 2, . . . Q) BEC channel. For convenience, the length-L code is referred to herein as the "mother code" and each of its Q subsets as a "subcode". All the coded bits of subcode q will be assigned to the surrogate BEC indexed by q. Since the Q subcodes share the same CND parity constraint, they will interact with each other via the coupling of the bit interleaver. Therefore, they are different from the multi-level codes developed for non-uniform parallel channels.

Given the node/edge perspective degree distribution of a LDPC code, the average erasure probability becomes a convex combination of the subchannel erasure probabilities, and the weights are determined by the profile of the bit interleaver. Therefore, the goal of the bit interleaver design boils down to the constrained optimization of its degree profile (subject to the restrictions on the VND and CND degree distribution of the mother code) so that the decoding threshold SNR (assuming using message passing algorithm) is minimized.

Although the cardinality of the Q subsets are the same, their VND degree distribution may take different forms. Assume the number of edges incident to the q-th BEC subchannel is given by $E_q$ and the total number of edges of the mother code sums up to E, then the proportion of edges assigned to the q-th subcode is given by $$w_q = \frac{E_q}{E}. \quad (6)$$

Following the notations in equation (4), the edge-perspective VND degree distribution for the q-th subcode becomes $$\lambda_q(x) = \sum_{i=1}^{d_v} \lambda_{q,i} x^{i-1}, \quad (7)$$

Where $\lambda_{q,i}$ denotes the proportion of edges incident to VND of degree i and allocated to BEC channel q, with $$\lambda_i = \sum_{q=1}^{Q} w_{q,i} \text{ and } \sum_{i=1}^{d_v} \lambda_{q,i} = 1, \text{ for } q = 1, 2, \ldots Q.$$

Then, $$\lambda(x) = \sum_{q=1}^{Q} w_q \lambda_q(x). \tag{8}$$

Following the definition for the degree profile of a LDPC code ensemble, the configuration of the bit interleaver ensemble ($\Lambda$) can be uniquely determined by the Q edge-perspective degree sequences $\Lambda \doteq \{\lambda_{q,i};\ 1 \leq q \leq Q,\ 1 \leq i \leq d_v\}$. Assuming the decoding process over the parallel BEC channels is ergodic, then the density evolution (DE) reduces to a one-dimensional recursion regarding the average erasure probability, namely $$\varepsilon_q^l = \varepsilon_q^0 \lambda_q(\alpha^l), \tag{9a}$$

$$\alpha^l = 1 - \rho(1 - \beta^{l-1}) \tag{9b}$$

$$\beta^{l-1} = \sum_{q=1}^{Q} w_q \varepsilon_q^{l-1}, \tag{9c}$$

where the superscript l and the subscript q represent the iteration index and the BEC subchannel number, respectively, $\varepsilon$ designates the erasure probability at the output of a single BEC subchannel, and $\alpha$ and $\beta$ denote the averaged erasure probabilities at the output of the CND and VND, respectively. Finally, the edge proportion of subchannel q defined by equation (6) can be rewritten as a function of $\Lambda$:

$$w_q = \frac{\frac{1}{\sum_i (\lambda_{q,i}/i)}}{\sum_{q=1}^{Q} \frac{1}{(\sum_i \lambda_{q,i}/i)}}, q = 1, 2, \ldots Q. \tag{10}$$

By combining equations (9a)-(9c) with equation (10), we can see that the decoding trajectory is determined by $\Lambda$, the degree profile of the bit interleaver ensemble. Taking the partial derivative of $\varepsilon_q^l$ with respect to $\varepsilon_k^{l-1}$ yields $$\frac{\partial \varepsilon_q^l}{\partial \varepsilon_k^{l-1}} = \varepsilon_q^0 w_k \frac{\partial \lambda_q(u)}{\partial u} \frac{\partial \rho(r)}{\partial r}, \tag{11}$$

where $u = 1 - \rho(r)$ and $r = 1 - \sum_{k=1}^{Q} w_k \varepsilon_k^{l-1}$. When the SNR is close to the decoding threshold, we have $$\lim_{\varepsilon_k^{l-1} \to 0} r = 1, \tag{12a}$$

$$\lim_{\varepsilon_k^{l-1} \to 0} u = 0, \tag{12b}$$

$$\lim_{u \to 0} \lambda_q'(u) = \lambda_{q,2}, \tag{12c}$$

$$\lim_{r \to 1} \rho'(r) = \sum_{j=2}^{d_c} (j-1)\rho_j. \tag{12d}$$

Employing Taylor series, equation (11) can be expanded around the neighborhood of $\varepsilon_k^{l-1} \approx 10$. By keeping the first-order term and considering the limit values in (12c) and (12d), we have $$\varepsilon_p^l = \varepsilon_q^0 \rho'(1) \lambda_{q,2} \sum_{k=1}^{Q} w_k \varepsilon_k^{l-1},\ l > 0,\ 1 \leq q \leq Q. \tag{13}$$

By collecting $\{\varepsilon_q^l, 1 \leq q \leq Q\}$ into a column vector $\Theta^l = [\varepsilon_1^l \varepsilon_2^l \ldots \varepsilon_q^l]^T$, where the superscript T denotes transpose, and introducing a constant matrix $\Psi$, whose (q, k)-entry is defined by $$\eta_{q,k} = \varepsilon_q^0 \rho'(1) \lambda_{q,2} w_k,\ 1 \leq q,\ k \leq Q. \tag{14}$$

The dynamic behavior of the message-passing decoder around the decoding threshold SNR can be approximated by the first-order linear difference equation:

$$\Theta^l = \Psi \Theta^{l-1}. \tag{15}$$

Without loss of generality, we assume $\Psi$ can be diagonalized and the magnitude of its eigenvalues are arranged in descending order as $|\tau_1| \geq |\tau_2| \geq \ldots \geq |\tau_Q|$. It follows that a necessary condition for the convergence of the iterative decoding is $$|\tau_1| < 1 \tag{16}$$

To summarize, when a given LDPC code is transmitted over Q non-uniform channels and decoded by a message-passing algorithm, its performance will depend on the degree profile $\Lambda$ of the bit interleaver that is inserted between the encoder and the channel. In particular, the decoding threshold SNR $\gamma$ is a function of $\Lambda$ and the dependence can be explicitly expressed as $\gamma(\Lambda)$. By combining the constraints in equation (4), (7), (10) and (16), the configuration of the code-dependent bit interleaver can be formulated as the solution to the following constrained (10) optimization problem:

$$\min_\Lambda \gamma(\Lambda) \tag{17a}$$

subject to $$|\tau_1| < 1; \tag{17b}$$

$$\sum_{q=1}^{Q} w_q \lambda_{q,i} = \lambda_i,\ 1 \leq i \leq d_v; \tag{17c}$$

$$\sum_{i=1}^{d_v} \lambda_{q,i} = 1,\ 1 \leq q \leq Q; \tag{17d}$$

-continued $$w_q = \frac{\frac{1}{\sum_i (\lambda_{q,i}/i)}}{\sum_{q=1}^{Q} \frac{1}{(\sum_i \lambda_{q,i}/i)}}, 1 \le q \le Q; \quad (17e)$$

$$\lambda_{q,i} \ge 0, 1 \le q \le Q, 1 \le i \le d_v \quad (17f)$$

where $\{\lambda_i\}_{i=1}^{d_v}$, are known a priori as the edge-perspective VND degree distribution of the mother code.

Figure 4:
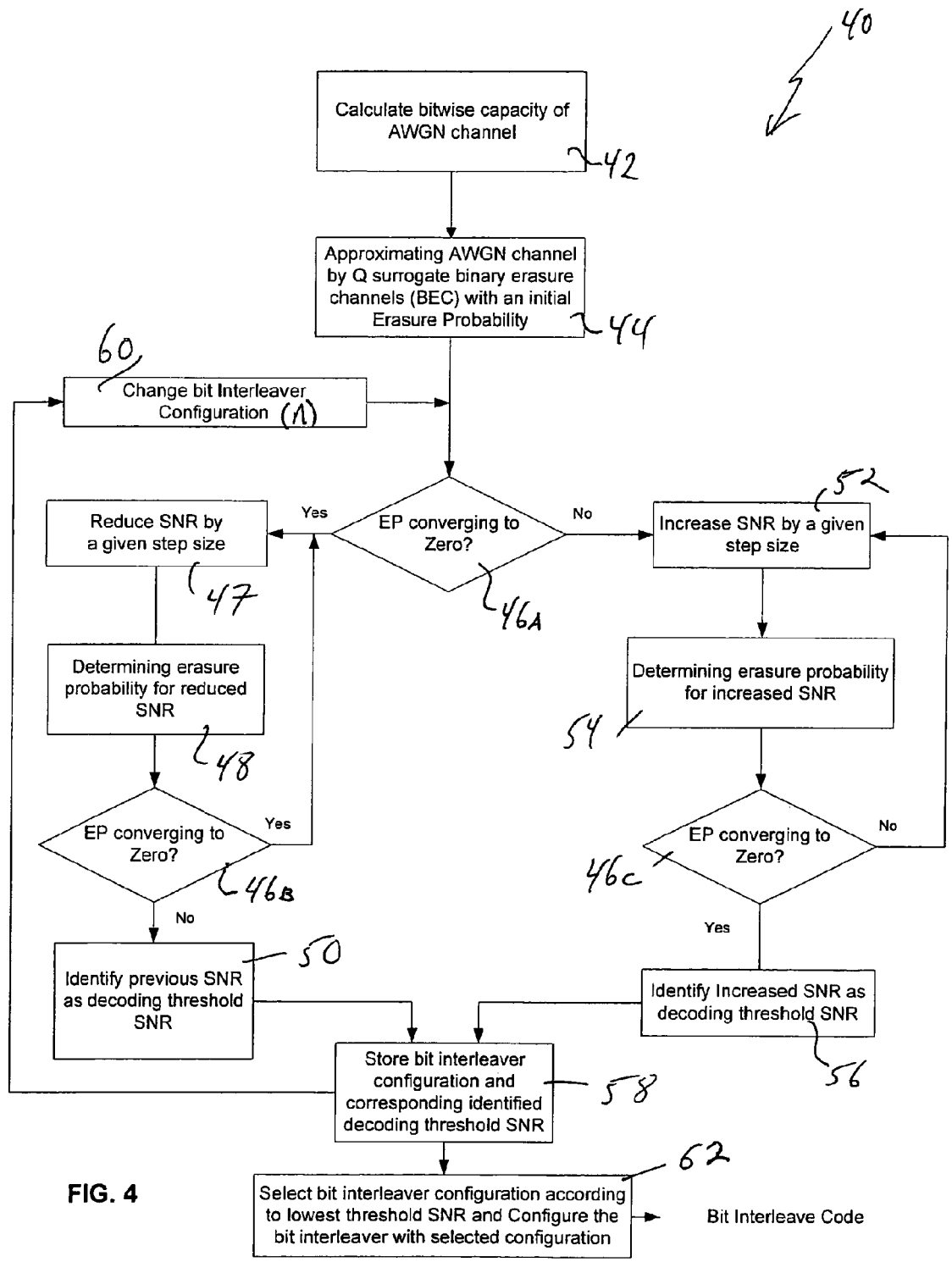
FIG. 4 is a flow diagram of the method for code matched interleaving over surrogate channels according to an implementation of the invention.
Figure 5:
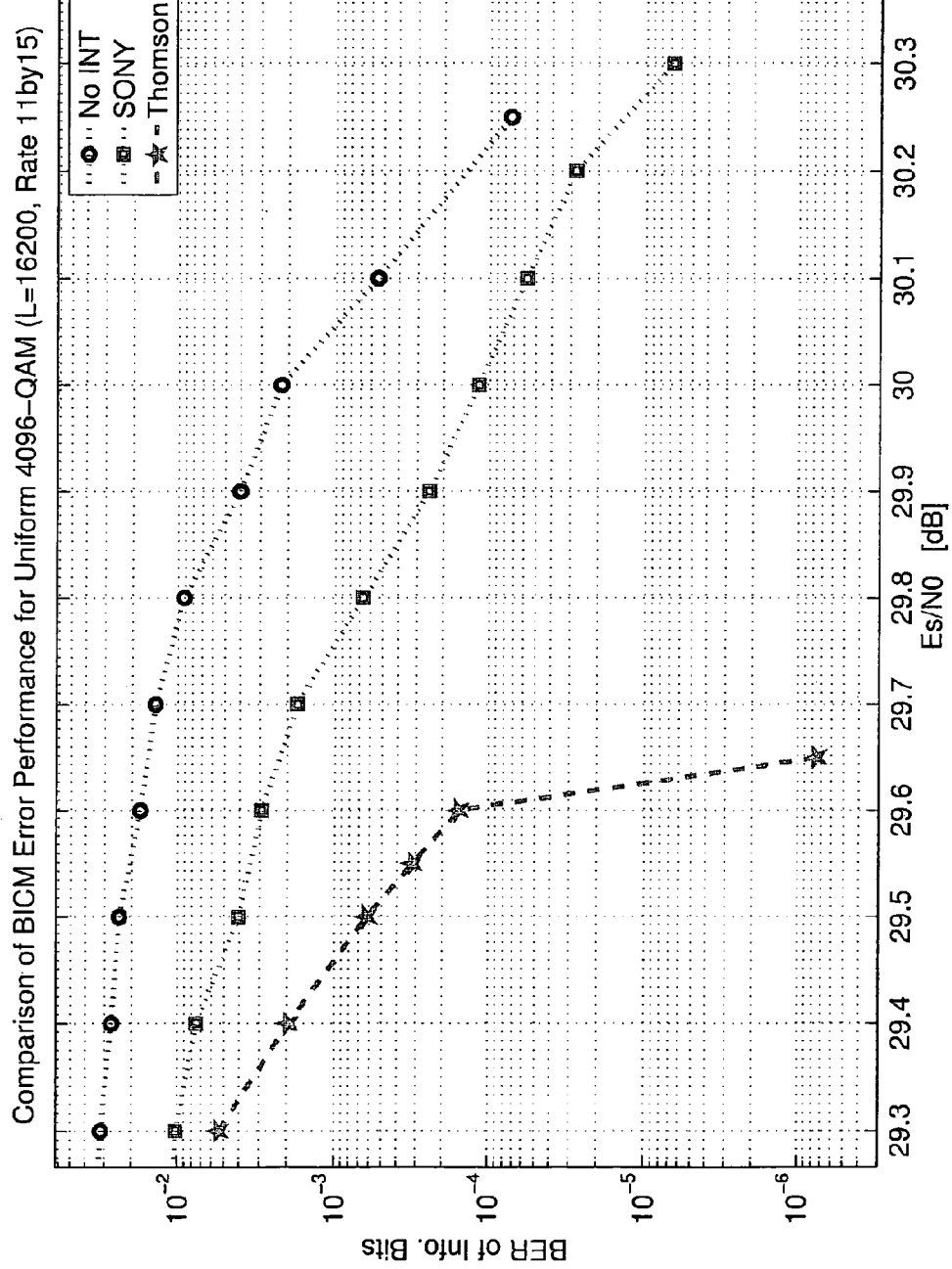
FIGS. 5-8 are graphical representations of comparisons of decoded BER of two rates and the resulting power savings provided by the apparatus and method of the invention.
Figure 6:
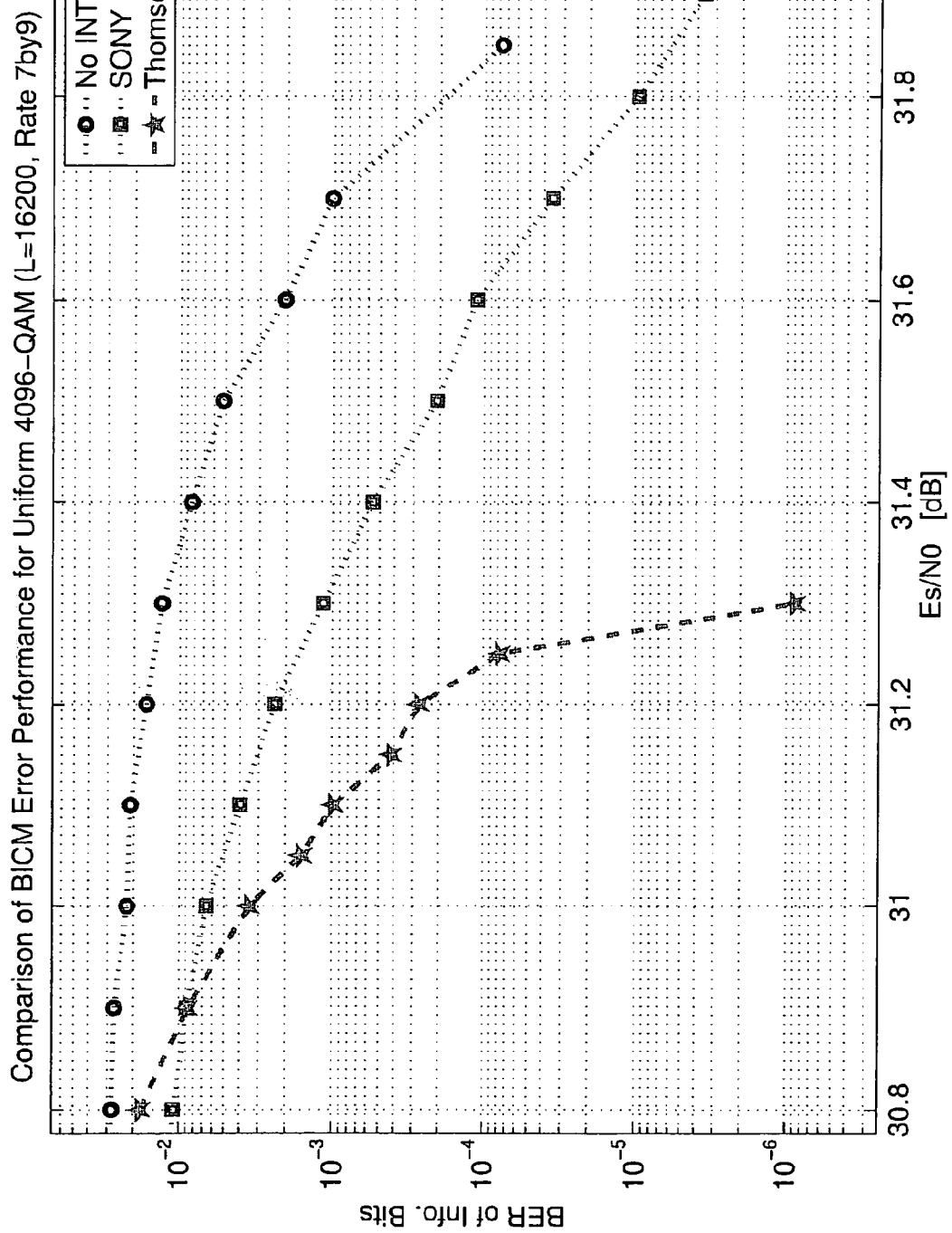
Figure 7:
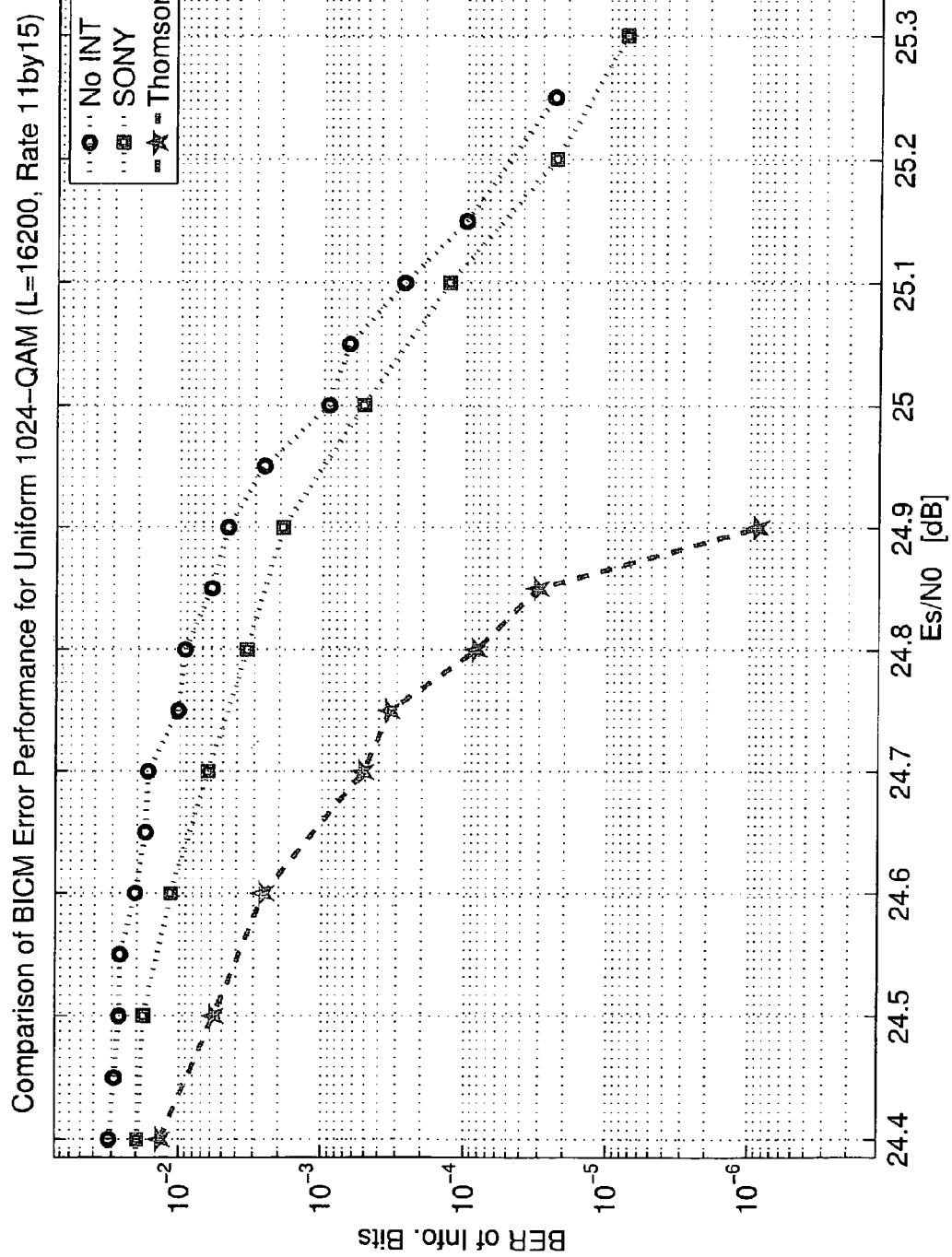
Figure 8:
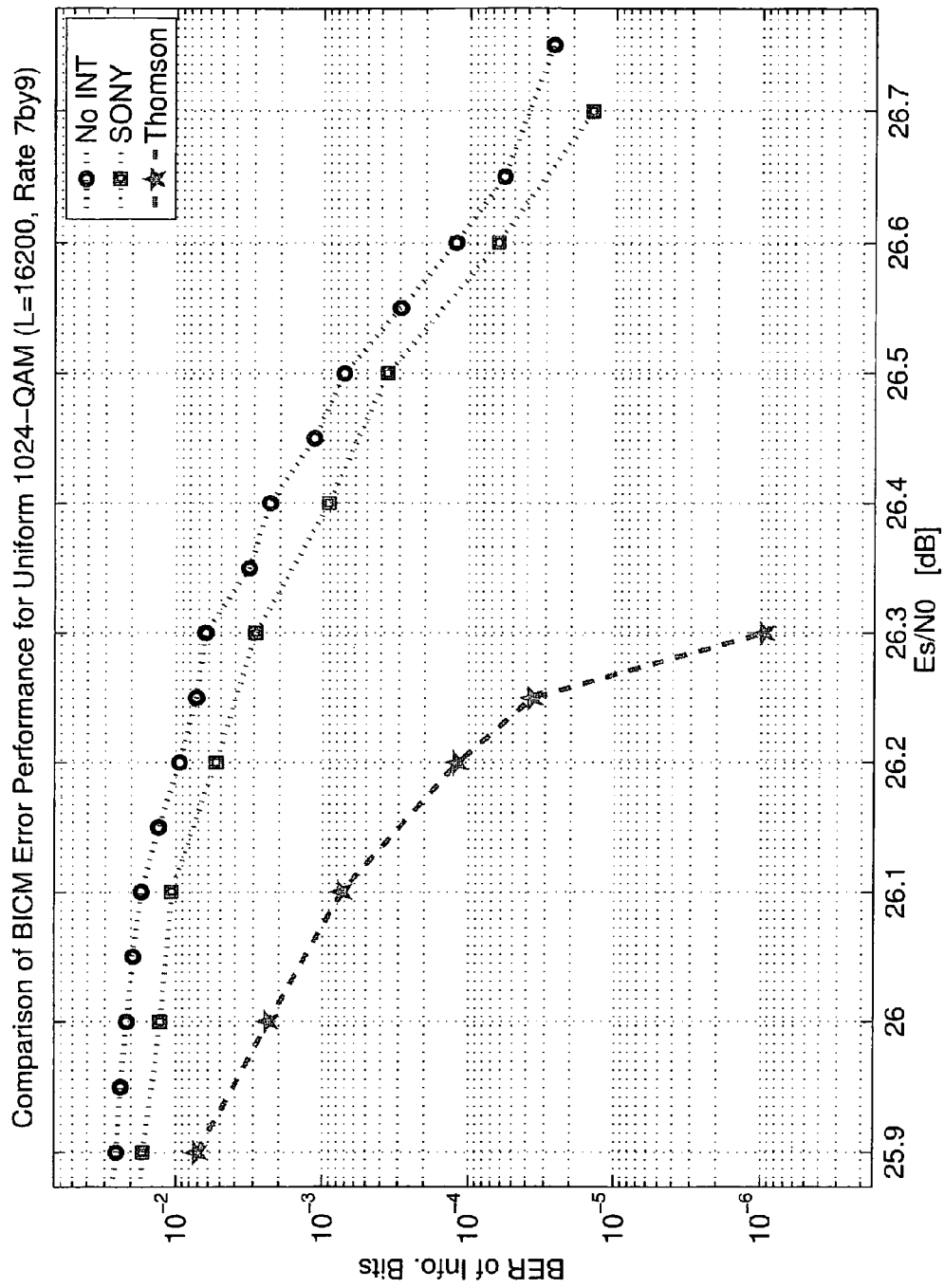

FIG. 4 shows a high level flow diagram of the method 40 for adapting a bit interleaver to LDPC codes and modulations under AWGN channel conditions according to an implementation of the invention. As described above, for a composite channel comprising a modulator, a demodulator and an AWGN channel with an initial SNR and for a given bit interleaver configuration determined by Λ, initially the capacities of equivalent Q parallel BIAWGN channels are calculated (42). Once calculated, the Q BIAWGN channels are modeled 44 (approximated) by Q surrogate binary erasure channels (BEC) based on an equivalence of the calculated capacities to obtain initial erasure probabilities (See Equation 3 above). An iterative density evolution determination is then made (46a) as to whether the erasure probability converges to zero (0) (see Equations 9a-9c above): (I) If yes, the SNR is reduced (47) by a given step-size. Those of skill in the art will recognize that the given step size may be based, for example, on a desired resolution and for exemplary purposes could be 0.1 db.

The initial erasure probabilities are then determined (48) and density evolution is used (46b) to determine the convergence of the erasure probabilities to zero. If yes at 46b, the SNR is again reduced (47) and the process is repeated. If no at 46b, the previous SNR is identified (50) as threshold SNR for the given bit interleaver configuration Λ and stored 58. (II) If at step 46a the erasure probability does not converge to zero, the SNR is increased (52) by a given step-size, and the same process mentioned above repeats where the erasure probability for the increased SNR is determined (54), and the density evolution is used to determine if the erasure probably converges to zero (46c). When the erasure probability converges to zero at 46c, that SNR is identified (56) as the decoding threshold SNR for the given bit interleaver configuration Λ and then stored as well (58). When the erasure probability at step 46c does not converge to zero, the SNR is again increased (52) and the process continues as described above. Those of skill in the art will recognize that there are multiple ways to determine the threshold SNR for a given bit interleaver configuration according to the spirit of this invention. Once the inner loop has been run for a given or initial bit interleaver configuration Λ, the bit interleaver configuration Λ is changed (60) and the process is run again. At some point in this process, and depending on, for example, time constraints and/or accuracy requirements, the bit interleaver configuration is selected and the bit interleaver is configured according to the selection (62).

Those of skill in the art will also recognize that in order to obtain or get minimum threshold SNR, we must change the bit interleaver configuration Λ. In doing this, it is recognized that finding the correct Λ that results in the lowest decoding threshold SNR can be difficult and could result in many samples being tested. As such, there can be an alternative implementation where the stopping point (62) is subjective and set by the user/designer. This can be termed a brute force method of stopping the testing and taking the best or lowest decoding threshold SNR obtained at that point. For example, the one brute force method could simply be a timing constraint on testing of decoding threshold SNRs.

Once the minimum or lowest threshold SNR is determined or selected (62), the bit interleaver is then configured according to the corresponding bit interleaver configuration Λ. Once so configured, the code can be bit interleaved.

To test the efficacy of the proposed design methodology for bit interleavers, we use the short block length (L=16200) LDPC codes specified in the DVB-S2/T2 standards as the mother code of the bit interleaver and consider the BRGC labeled square 1024-QAM and 4096-QAM constellations, which are proposed to be deployed in the next generation of cable channels.

In contrast to the analytical study presented by the present invention, an ad hoc bit interleaving method based on the avoidance of "CND collision" has been used in DVB-T2 and is also proposed for DVB-C2, where the term "CND collision" refers to the phenomenon that there are more than two bits mapped to the same symbol and checked by the same parity equation. In general, the absolute avoidance of CND collision is difficult and a brute-force search for any feasible realization involves a combinatorial programming problem, which is computationally intensive. Nevertheless, by making use of the regularity in the quasi-cyclic structure of the DVBS2 codes, researchers have come up with a bit interleaving strategy that can avoid the occurrence of CND collisions for a subset of code rates.

However, we recognize that the occurrence of CND collision is not necessarily bad, especially when a high-degree VND is connected to a low-degree VND via a common CND. This is because the high-degree VND usually carries LLR messages of higher reliability, which can help the low-degree VND to achieve a fast decoding convergence. Therefore, in our design and simulations, we ignore the occurrence of CND collision, and simply allocate the coded bits to the constellation mapper in their natural order and according to the optimized degree profile specified by Λ.

Throughout this section, we consider Monte-Carlo simulation results and use the "no-interleaving" (continuous bits grouping and mapping to constellation mapper) as a common benchmark. For each type of interleaving/non-interleaving, the simulation trial is terminated when 50 frame errors have been detected. A comparison of decoded BER for information bits are given in FIG. 5 to FIG. 8 for two code rates ($11/15$ and $7/9$) and two modulation formats (4096- and 1024-QAM). It can be observed from these curves that the bit interleaver designed using surrogate BEC channels can achieve significant power savings (gain of 0.4-0.7 dB) over the interleavers seeking the avoidance of CND-collision. Besides, both of them outperform the scenario without bit interleaving, which demonstrates that a dedicated bit interleaver is necessary to trade off the spectral efficiency and power efficiency when an irregular LDPC code is transmitted over a non-uniform channel.

These and other features and advantages of the present principles may be readily ascertained by one of ordinary skill in the pertinent art based on the teachings herein. It is to be understood that the teachings of the present principles may be implemented in various forms of hardware, software, firmware, special purpose processors, or combinations thereof.

Most preferably, the teachings of the present principles are implemented as a combination of hardware and software. Moreover, the software may be implemented as an application program tangibly embodied on a program storage unit. The application program may be uploaded to, and executed by, a machine comprising any suitable architecture. Preferably, the machine is implemented on a computer platform having hardware such as one or more central processing units ("CPU"), a random access memory ("RAM"), and input/output ("I/O") interfaces. The computer platform may also include an operating system and microinstruction code. The various processes and functions described herein may be either part of the microinstruction code or part of the application program, or any combination thereof, which may be executed by a CPU. In addition, various other peripheral units may be connected to the computer platform such as an additional data storage unit and a printing unit.

It is to be further understood that, because some of the constituent system components and methods depicted in the accompanying drawings are preferably implemented in software, the actual connections between the system components or the process function blocks may differ depending upon the manner in which the present principles are programmed. Given the teachings herein, one of ordinary skill in the pertinent art will be able to contemplate these and similar implementations or configurations of the present principles.

Although the illustrative embodiments have been described herein with reference to the accompanying drawings, it is to be understood that the present principles is not limited to those precise embodiments, and that various changes and modifications may be effected therein by one of ordinary skill in the pertinent art without departing from the scope or spirit of the present principles. All such changes and modifications are intended to be included within the scope of the present principles as set forth in the appended claims.

The invention claimed is:

1. A method for configuring a bit interleaver to LDPC codes and modulations comprising:
    calculating a bitwise capacity of non-uniform parallel AWGN channels;
    approximating said AWGN channels with a set of Q surrogate binary erasure channels with an erasure probability;
    determining whether a decoding threshold signal-to-noise ratio results in a lowest decoding threshold signal-to-noise ratio for a bit interleaver configuration using erasure probability density distributions; and
    configuring the bit interleaver based on the bit interleaver configuration corresponding to the determined lowest decoding threshold signal-to-noise ratio, wherein said determining further comprises:
    reducing the SNR by a predetermined step size when the erasure probability converges to zero;
    determining the erasure probability for the reduced SNR;
    determining whether the erasure probability of the reduced SNR converges to zero; and
    identifying the SNR prior to said reducing as the decoding threshold SNR for the bit interleaver configuration when the erasure probability does not converge to zero.

2. The method of claim 1, wherein said determining further comprises:
    increasing the SNR by a predetermined step size when the erasure probability does not converge to zero;
    determining the erasure probability for the increased SNR;
    determining whether the erasure probabiligy for the increased SNR converges to zero; and
    identifying the increased SNR as the decoding threshold SNR for the bit interleaver configuration when the erasure probabilty converges to zero.

3. The method according to claim 2, further comprising the steps of:
    storing each bit interleaver configuration and corresponding determined lowest decoding threshold SNR;
    changing the bit interleaver configuration ($\Lambda$);
    performing said step of determining to determine the decoding threshold SNR for the changed bit interleaver configuration;
    selecting a bit interleaver configuration having the lowest decoding threshold SNR; and
    configuring the bit interleaver with the selected configuration.

4. The method according to claim 1, wherein said determining further comprises determining an average erasure probability density distribution modeled from a predetermined linear difference equation from the decoding threshold SNR.

5. The method of claim 4, wherein said determining of the average erasure probability further comprises:
    identifying node/edge perspective degree distributions of the LDPC code;
    convex combining of the erasure probability of each subchannel.

6. The method according to claim 4, wherein the density distribution modeling is derived from the following:

$$\varepsilon_q^l = \varepsilon_q^0 \lambda_q(\alpha^l),$$
$$\alpha^l = 1 - \rho(1 - \beta_{l-1})$$
$$\beta^{l-1} = \sum_{q=1}^{Q} w_q \varepsilon_q^{l-1}.$$

7. The method according to claim 2, further comprising minimizing the decoding threshold SNR by constraining optimization of a degree profile of the bit interleaver.

8. An apparatus for configuring a bit interleaver to LDPC codes and modulations comprising:
    a processor configured to calculate a bitwise capacity of non-uniform parallel AWGN channels, to approximate the AWGN channels with a set of surrogate binary erasure channels, and to determine a decoding threshold SNR for each of one or more bit interleaver configurations using erasure probability density distributions, wherein said processor determines an erasure probability for each determined SNR;
    a memory for storing the one or more determined decoding threshold SNR and corresponding bit interleaver configuration; and
    a bit interleaver being configured by said processor based on the bit interleaver configuration corresponding to a selected lowest decoding threshold SNR from the stored one or more determined decoding threshold SNR, wherein the processor further determines an average erasure probability density distribution modeled from a predetermined linear difference equation from the determined one or more decoding threshold SNR.

9. The apparatus according to claim 8, wherein the processor determines the average erasure probability by identifying node/edge perspective degree distributions of the LDPC code, and convex combining of the erasure probability of each subchannel.

10. The apparatus according to claim 9, wherein the density distribution modeling is derived from the following:

$$\varepsilon_q^l = \varepsilon_q^0 \lambda_q(\alpha^l),$$
$$\alpha^l = 1 - \rho(1 - \beta_{l-1})$$
$$\beta^{l-1} = \sum_{q=1}^{Q} w_q \varepsilon_q^{l-1}.$$

11. A method for configuring a receiver bit interleaver to LDPC codes and modulations comprising:
  calculating a bitwise capacity of non-uniform parallel AWGN channels;
  approximating said AWGN channels with a set of Q surrogate binary erasure channels with an erasure probability;
  determining whether a decoding threshold signal-to-noise ratio results in a lowest decoding threshold signal-to-noise ratio for a bit interleaver configuration using erasure probability density distributions; and
  configuring the receiver bit interleaver based on the bit interleaver configuration corresponding to the determined lowest decoding threshold signal-to-noise ratio, wherein said determining further comprises:
  reducing the SNR by a predetermined step size when the erasure probability converges to zero;
  determining the erasure probability for the reduced SNR;
  determining whether the erasure probability of the reduced SNR converges to zero; and
  identifying the SNR prior to said reducing as the decoding threshold SNR for the bit interleaver configuration when the erasure probability does not converge to zero.

12. The method of claim 11, wherein said determining further comprises:
  increasing the SNR by a predetermined step size when the erasure probability does not converge to zero;
  determining the erasure probability for the increased SNR;
  determining whether the erasure probabiligy for the increased SNR converges to zero; and
  identifying the increased SNR as the decoding threshold SNR for the bit interleaver configuration when the erasure probabilty converges to zero.

13. The method according to claim 12, further comprising the steps of:
  storing each bit interleaver configuration and corresponding determined lowest decoding threshold SNR;
  changing the bit interleaver configuration (Λ);
  performing said step of determining to determine the decoding threshold SNR for the changed bit interleaver configuration;
  selecting a bit interleaver configuration having the lowest decoding threshold SNR; and
  configuring the bit interleaver with the selected configuration.

14. The method according to claim 11, wherein said determining further comprises determining an average erasure probability density distribution modeled from a predetermined linear difference equation from the decoding threshold SNR.

15. The method of claim 14, wherein said determining of the average erasure probability further comprises:
  identifying node/edge perspective degree distributions of the LDPC code;
  convex combining of the erasure probability of each subchannel.

16. The method according to claim 14, wherein the density distribution modeling is derived from the following:

$$\varepsilon_q^l = \varepsilon_q^0 \lambda_q(\alpha^l),$$
$$\alpha^l = 1 - \rho(1 - \beta_{l-1})$$
$$\beta^{l-1} = \sum_{q=1}^{Q} w_q \varepsilon_q^{l-1}.$$

17. The method according to claim 12, further comprising minimizing the decoding threshold SNR by constraining optimization of a degree profile of the bit interleaver.

18. An apparatus for configuring a receiver bit interleaver to LDPC codes and modulations comprising:
  a processor configured to calculate a bitwise capacity of non-uniform parallel AWGN channels, to approximate the AWGN channels with a set of surrogate binary erasure channels, and to determine a decoding threshold SNR for each of one or more bit interleaver configurations using erasure probability density distributions, wherein said processor determines an erasure probability for each determined SNR;
  a memory for storing the one or more determined decoding threshold SNR and corresponding bit interleaver configuration; and
  a receiver bit interleaver being configured by said processor based on the bit interleaver configuration corresponding to a selected lowest decoding threshold SNR from the stored one or more determined decoding threshold SNR, wherein the processor further determines an average erasure probability density distribution modeled from a predetermined linear difference equation from the determined one or more decoding threshold SNR.

19. The apparatus according to claim 18, wherein the processor determines the average erasure probability by identifying node/edge perspective degree distributions of the LDPC code, and convex combining of the erasure probability of each subchannel.

20. The apparatus according to claim 18, wherein the density distribution modeling is derived from the following:

$$\varepsilon_q^l = \varepsilon_q^0 \lambda_q(\alpha^l),$$
$$\alpha^l = 1 - \rho(1 - \beta_{l-1})$$
$$\beta^{l-1} = \sum_{q=1}^{Q} w_q \varepsilon_q^{l-1}.$$

21. A method for configuring a bit interleaver to LDPC codes and modulations comprising:
  calculating a bitwise capacity of non-uniform parallel AWGN channels;
  approximating said AWGN channels with a set of Q surrogate binary erasure channels with an erasure probability;
  determining whether a decoding threshold signal-to-noise ratio results in a lowest decoding threshold signal-to-noise ratio for a bit interleaver configuration using erasure probability density distributions; and configuring the bit interleaver based on the bit interleaver configuration corresponding to the determined lowest decoding threshold signal-to-noise ratio, wherein said calculated bitwise capacity further comprises calculating the bitwise capacity based on mutual information between a binary input and an effective output of the parallel AWGN channels, said approximating being based on an equivalence of the calculated bitwise capacity.

22. An apparatus for configuring a bit interleaver to LDPC codes and modulations comprising:
a processor configured to calculate a bitwise capacity of non-uniform parallel AWGN channels, to approximate the AWGN channels with a set of surrogate binary erasure channels, and to determine a decoding threshold SNR for each of one or more bit interleaver configurations using erasure probability density distributions, wherein said processor determines an erasure probability for each determined SNR;
a memory for storing the one or more determined decoding threshold SNR and corresponding bit interleaver configuration; and
a bit interleaver being configured by said processor based on the bit interleaver configuration corresponding to a selected lowest decoding threshold SNR from the stored one or more determined decoding threshold SNR, wherein the processor calculates the bitwise capacity based on mutual information between a binary input and an effective output of the parallel AWGN channels.

23. An apparatus for configuring a bit interleaver to LDPC codes and modulations comprising:
a processor configured to calculate a bitwise capacity of non-uniform parallel AWGN channels, to approximate the AWGN channels with a set of surrogate binary erasure channels, and to determine a decoding threshold SNR for each of one or more bit interleaver configurations using erasure probability density distributions, wherein said processor determines an erasure probability for each determined SNR;
a memory for storing the one or more determined decoding threshold SNR and corresponding bit interleaver configuration; and
a bit interleaver being configured by said processor based on the bit interleaver configuration corresponding to a selected lowest decoding threshold SNR from the stored one or more determined decoding threshold SNR, wherein said bit interleaver is configured to bit interleave the code based on conditions for decoding convergence of decoding iterations derived from each determined erasure probability corresponding to each respective threshold SNR.

24. A method for configuring a receiver bit interleaver to LDPC codes and modulations comprising:
calculating a bitwise capacity of non-uniform parallel AWGN channels; approximating said AWGN channels with a set of Q surrogate binary erasure channels with an erasure probability;
determining whether a decoding threshold signal-to-noise ratio results in a lowest decoding threshold signal-to-noise ratio for a bit interleaver configuration using erasure probability density distributions; and
configuring the receiver bit interleaver based on the bit interleaver configuration corresponding to the determined lowest decoding threshold signal-to-noise ratio, wherein said calculated bitwise capacity further comprises calculating the bitwise capacity based on mutual information between a binary input and an effective output of the parallel AWGN channels, said approximating being based on an equivalence of the calculated bitwise capacity.

25. An apparatus for configuring a receiver bit interleaver to LDPC codes and modulations comprising:
a processor configured to calculate a bitwise capacity of non-uniform parallel AWGN channels, to approximate the AWGN channels with a set of surrogate binary erasure channels, and to determine a decoding threshold SNR for each of one or more bit interleaver configurations using erasure probability density distributions, wherein said processor determines an erasure probability for each determined SNR;
a memory for storing the one or more determined decoding threshold SNR and corresponding bit interleaver configuration; and
a receiver bit interleaver being configured by said processor based on the bit interleaver configuration corresponding to a selected lowest decoding threshold SNR from the stored one or more determined decoding threshold SNR, wherein the processor calculates the bitwise capacity based on mutual information between a binary input and an effective output of the parallel AWGN channels.

* * * * *